United States Patent
Lee et al.

(10) Patent No.: US 10,157,989 B2
(45) Date of Patent: Dec. 18, 2018

(54) GRAPHENE ELECTRONIC DEVICE AND MANUFACTURING METHOD THEREOF

(75) Inventors: Chang Seung Lee, Gyeonggi-do (KR); Sang Wook Kim, Gyeonggi-do (KR); Seong Jun Park, Seoul (KR); David Seo, Gyeonggi-do (KR); Young Jun Yun, Gyeonggi-do (KR); Yung Hee Lee, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 261 days.

(21) Appl. No.: 13/478,548

(22) Filed: May 23, 2012

(65) Prior Publication Data
US 2013/0171781 A1    Jul. 4, 2013

(30) Foreign Application Priority Data
Jan. 2, 2012   (KR) .................. 10-2012-0000304

(51) Int. Cl.
| H01L 29/00 | (2006.01) |
|---|---|
| H01L 21/00 | (2006.01) |
| H01L 29/423 | (2006.01) |
| H01L 29/66 | (2006.01) |
| H01L 29/778 | (2006.01) |
| H01L 29/861 | (2006.01) |
| H01L 29/16 | (2006.01) |
| H01L 29/786 | (2006.01) |

(52) U.S. Cl.
CPC ...... H01L 29/4232 (2013.01); H01L 29/1606 (2013.01); H01L 29/66431 (2013.01); H01L 29/7781 (2013.01); H01L 29/78603 (2013.01); H01L 29/78684 (2013.01); H01L 29/861 (2013.01)

(58) Field of Classification Search
CPC ............. H01L 29/1606; H01L 29/4232; H01L 29/66431; H01L 29/7781; H01L 29/78684; H01L 29/78603
USPC ................................ 438/150, 197, 455, 458
See application file for complete search history.

(56) References Cited

U.S. PATENT DOCUMENTS

| 8,168,495 | B1 * | 5/2012 | Lim et al. ...................... 438/268 |
|---|---|---|---|
| 2009/0110627 | A1 * | 4/2009 | Choi ..................... B82Y 30/00 |
| | | | 423/447.1 |
| 2009/0169919 | A1 * | 7/2009 | Garcia et al. ................. 428/688 |
| 2009/0221130 | A1 * | 9/2009 | Asano .................... B82Y 10/00 |
| | | | 438/478 |
| 2010/0021708 | A1 | 1/2010 | Kong et al. |
| 2010/0127312 | A1 * | 5/2010 | Grebel et al. ................. 257/288 |

(Continued)

FOREIGN PATENT DOCUMENTS

WO    WO-2011-021715    2/2011

OTHER PUBLICATIONS

Korean Office Action dated Sep. 18, 2017 for corresponding Korean Patent Application No. 10-2012-0000304.

*Primary Examiner* — Dale E Page
*Assistant Examiner* — Quovaunda V Jefferson
(74) *Attorney, Agent, or Firm* — Harness, Dickey & Pierce, P.L.C.

(57) ABSTRACT

A method of manufacturing a graphene electronic device may include forming a metal compound layer and a catalyst layer on a substrate, the catalyst layer including a metal element in the metal compound layer, growing a graphene layer on the catalyst layer, and converting the catalyst layer into a portion of the metal compound layer.

20 Claims, 6 Drawing Sheets

(56) References Cited

U.S. PATENT DOCUMENTS

| | | |
|---|---|---|
| 2011/0006425 A1 | 1/2011 | Wada et al. |
| 2011/0033677 A1 | 2/2011 | Shin et al. |
| 2011/0070146 A1* | 3/2011 | Song et al. .................. 423/448 |
| 2011/0114919 A1 | 5/2011 | Jenkins et al. |
| 2011/0220875 A1 | 9/2011 | Jang |
| 2011/0309336 A1* | 12/2011 | Shin ................. B82Y 10/00 257/29 |
| 2012/0138903 A1* | 6/2012 | Chung et al. .................. 257/29 |
| 2012/0161098 A1 | 6/2012 | Hiura et al. |
| 2012/0256167 A1* | 10/2012 | Heo ................. H01L 29/1606 257/27 |

\* cited by examiner

GRAPHENE ELECTRONIC DEVICE AND MANUFACTURING METHOD THEREOF

CROSS REFERENCE TO RELATED APPLICATIONS

This application claims priority to and the benefit of Korean Patent Application No. 10-2012-0000304 filed in the Korean Intellectual Property Office on Jan. 2, 2012, the entire contents of which are incorporated herein by reference.

BACKGROUND

1. Field

Example embodiments provide a graphene electronic device and a manufacturing method thereof.

2. Description of the Related Art

Graphene is a two-dimensional planar structure of carbon atoms that are arranged in a honeycomb. Because the graphene is relatively thin, and has desirable thermal and electric conductivity, and relatively high physical and chemical stability, the graphene may be applied to semiconductor devices.

A graphene layer may be deposited in various ways. Although a small-area graphene layer may be deposited by a stripping method using a graphite crystal, a large-area graphene layer may be deposited with the help of a catalyst layer, which may make the deposition process complicated.

SUMMARY

Example embodiments provide a graphene electronic device and a manufacturing method thereof.

According to example embodiments, a method of manufacturing a graphene electronic device may include forming a metal compound layer and a catalyst layer on a substrate, the catalyst layer including a metal element in the metal compound layer, growing a graphene layer on the catalyst layer, and converting the catalyst layer into a portion of the metal compound layer.

The metal element may include at least one of copper (Cu), cobalt (Co), and nickel (Ni). The metal compound layer may include one of oxygen and sulfur. The metal compound layer may include at least one of CuS, $Cu_2S$, CuO, $Cu_2O$, CoO, and NiO, and the catalyst layer may include at least one of Cu, Co, Ni, and $CoO_x$ ($0<x<1$). The graphene layer may include one of monolayer graphene and multilayer graphene.

The converting may include heat treating the catalyst layer, and the method may further include forming source and drain electrodes on the graphene layer, forming an insulating layer on the graphene layer, and forming a gate electrode on the insulating layer.

According to example embodiments, a method of manufacturing a graphene electronic device may include forming a first insulating layer on a first substrate, forming a catalyst layer on the first insulating layer, the catalyst layer including a metal element, forming a graphene layer on the catalyst layer to form a structure including the first substrate, the catalyst layer, and the graphene layer, attaching the structure to a second substrate such that the graphene layer is closer to the second substrate than the first substrate, removing the first insulating layer to separate the first substrate from the second substrate, and forming a metal compound layer by combining the metal element in the catalyst layer with another element.

The metal element may include at least one of copper (Cu), cobalt (Co), and nickel (Ni). The metal compound layer may include one of oxygen and sulfur. The metal compound layer may include at least one of CuS, $Cu_2S$, CuO, $Cu_2O$, CoO, and NiO, and the catalyst layer may include at least one of Cu, Co, Ni, and $CoO_x$ ($0<x<1$). The graphene layer may include one of monolayer graphene and multilayer graphene.

The forming the metal compound layer may include heat treating the catalyst layer, and the method may further include forming a first electrode and a second electrode on the metal compound layer and the graphene layer, respectively.

Before the attaching the structure, the method may further include forming a second insulating layer on the second substrate, forming a third electrode on the second insulating layer, and forming a third insulating layer on the third electrode. The graphene layer may contact the third insulating layer.

According to example embodiments, a graphene electronic device may include a metal compound on a substrate, and a graphene layer on the substrate, wherein the metal compound layer includes a metal element configured to serve as a catalyst for growing the graphene layer.

The metal element may include at least one of copper (Cu), cobalt (Co), and nickel (Ni). The metal compound layer may include one of oxygen and sulfur. The metal compound layer may include at least one of CuS, $Cu_2S$, CuO, $Cu_2O$, CoO, and NiO. The graphene layer may include one of monolayer graphene and multilayer graphene.

The graphene layer may be disposed between the substrate and the metal compound layer, and the electronic device may further include first and second electrodes on the graphene layer and spaced apart from each other, an insulating layer on the graphene layer, and a third electrode on the insulating layer.

The graphene layer may be between the substrate and the metal compound layer, and the metal compound layer may expose a portion of the graphene layer. The electronic device may further include a first insulating layer between the substrate and the graphene layer, a second insulating layer between the first insulating layer and the graphene layer, a first electrode between the first insulating layer and the second insulating layer, a second electrode on the metal compound layer, and a third electrode on the graphene layer and spaced apart from the second electrode and the metal compound layer.

BRIEF DESCRIPTION OF THE DRAWINGS

Example embodiments will be more clearly understood from the following brief description taken in conjunction with the accompanying drawings. FIGS. 1 to 12 represent non-limiting, example embodiments as described herein.

DETAILED DESCRIPTION

Example embodiments will be described more fully hereinafter with reference to the accompanying drawings. As those skilled in the art would realize, the described example embodiments may be modified in various different ways, all without departing from the spirit or scope. In the drawing, parts having no relationship with the explanation are omitted for clarity, and the same or similar reference numerals designate the same or similar elements throughout the specification.

It will be understood that, although the terms "first", "second", etc. may be used herein to describe various elements, components, regions, layers and/or sections, these elements, components, regions, layers and/or sections are not to be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments are not to be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, is to be interpreted as having a meaning that is consistent with their meaning in the context of the relevant art and will not be interpreted in an idealized or overly formal sense unless expressly so defined herein.

A graphene electronic device and a manufacturing method thereof according to example embodiments are described in detail with reference to FIGS. 1 and 2.

Figure 1:
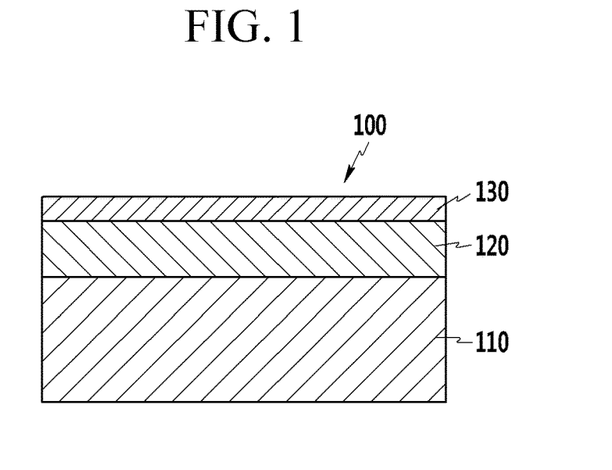
FIG. 1 is a schematic sectional view of a graphene electronic device according to example embodiments.
Figure 2:
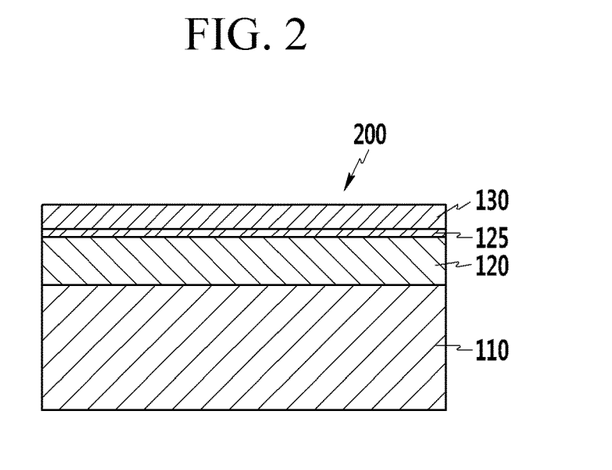
FIG. 2 is a schematic sectional view illustrating a method of manufacturing the graphene electronic device shown in FIG. 1.

FIG. 1 is a schematic sectional view of a graphene electronic device according to example embodiments, and FIG. 2 is a schematic sectional view illustrating a method of manufacturing the graphene electronic device shown in FIG. 1.

Referring to FIG. 1, a graphene electronic device 100 according to example embodiments may include a substrate 110, and a metal compound layer 120 and a graphene layer 130 deposited on the substrate 110 in sequence. The substrate 110 may include a semiconductor substrate, and may include silicon.

The metal compound layer 120 includes a metal element and at least one other element that forms a metal compound along with the metal element. The metal element may serve as a catalyst for graphene growth, and may include copper (Cu), cobalt (Co), and/or nickel (Ni). The at least one other element forming the metal compound may include oxygen (O) and sulfur (S). For example, the metal compound layer 120 may include at least one of CuS, $Cu_2S$, CuO, $Cu_2O$, CoO, and NiO. The compounds CuS, CuO, and NiO may be semiconductive, and the compounds $Cu_2S$, $Cu_2O$, and CoO may be insulative.

The graphene layer 130 may include monolayer graphene or multilayer graphene. The graphene layer 130 may be semiconductive under some conditions and conductive under other conditions.

Between the substrate 110 and the metal compound layer 120, for example, an insulating layer (not shown) or a conductive layer (not shown) may be disposed. In example embodiments, the layers between the substrate 110 and the metal compound layer 120 may be referred to as a part of the substrate 110.

The graphene electronic device 100 according to example embodiments may include an insulating layer (not shown), a conductive layer (not shown), and/or a semiconductor layer (not shown), in addition to the metal compound layer 120 and the graphene layer 130 to form a diode or a transistor.

According to a method of manufacturing the graphene electronic device 100 as shown in FIG. 1, referring to FIG. 2, a metal compound layer 120 may be deposited on a substrate 110. The deposition of the metal compound layer 120 may be performed by sputtering and/or evaporation.

Thereafter, a catalyst layer 125 including a metal element that is included in the metal compound layer 120 may be deposited on the metal compound layer 120. The catalyst layer 125 may include at least one of Cu, Co, Ni, and $CoO_x$ ($0<x<1$). Among them, the compound $CoO_x$ may show a stronger metallic property to serve as a catalyst for forming a graphene layer 130 when $x<1$. The deposition of the catalyst layer 125 may be also performed by sputtering and/or evaporation.

The composition from the metal compound layer 120 to the catalyst layer 125 may be continuous at least in part. For example, the composition ratio of an element combined with a metal element may decrease gradually from a lowest portion of the metal compound layer 120 to a highest portion of the catalyst layer 125. For example, when CuO occupies a lower end of the metal compound layer 120 and Cu occupies an upper end of the catalyst layer 125, $CuO_x$ (0<x<1), where x increases from bottom to top, may be included between the lower end and the upper end.

A graphene layer 130 may be grown on the catalyst layer 125 by chemical vapor deposition (CVD) to form a structure 200. The catalyst layer 125 may be converted into a portion of the metal compound layer 120. The conversion may be performed by heat treatment of the structure 200, sometimes under an $O_2$ or S atmosphere. During the heat treatment process, another element other than the metal element contained in the metal compound layer 120, for example, oxygen or sulfur, may be introduced into the catalyst layer 125 to combine with the metal element in the catalyst layer 125. When the heat treatment is performed under an oxygen or sulfur atmosphere, oxygen or sulfur from the atmosphere may be introduced into the catalyst layer 125 to combine with the metal element in the catalyst layer 125.

As described above, the catalyst layer 125 used for growing the graphene layer 130 may be combined with another element to form a semiconductor or an insulator that forms a part of the graphene electronic device. Therefore, the catalyst layer 125 may not be removed and a process of forming a separate semiconductor layer of an insulating layer instead of the metal compound layer 120 may be omitted, thereby simplifying the manufacturing process of the electronic device.

Figure 3:
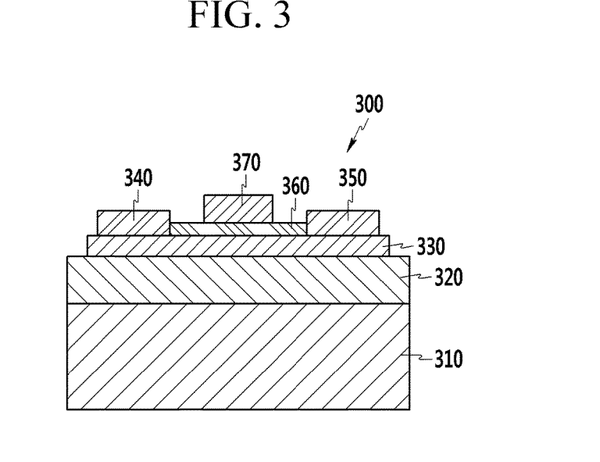
FIG. 3 is a schematic sectional view of a thin film transistor according to example embodiments.

FIG. 3 is a schematic sectional view of a thin film transistor according to example embodiments. Referring to FIG. 3, a thin film transistor 300 according to example embodiments may include a substrate 310, a bottom insulating layer 320, a semiconductor layer 330, source and drain electrodes 340 and 350, a gate insulating layer 360, and a gate electrode 370.

The substrate 110 may include a semiconductor substrate, and may include silicon. The bottom insulating layer 320 may be disposed on the substrate 310, and may include at least one of $Cu_2S$, $Cu_2O$, and CoO. The semiconductor layer 330 may be disposed on the bottom insulating layer 320, and may include monolayer graphene or multilayer graphene.

The bottom insulating layer 320 and the semiconductor layer 330 correspond to the metal compound layer 120 and the graphene layer 130 shown in FIG. 1, respectively, and may be formed by the above-described process described with reference to FIG. 2.

The source and drain electrodes 340 and 350 may be disposed on the semiconductor layer 330, and spaced apart from each other. The source and drain electrodes 340 and 350 may include a conductive material, for example, a metal.

The gate insulating layer 360 may be disposed between the source electrode 340 and the drain electrode 350 on the semiconductor layer 330, and may include an oxide or a nitride.

The gate electrode 370 may be disposed on the gate insulating layer 360 and may be spaced apart from the source and drain electrodes 340 and 350. The gate electrode 370 may include a conductive material, for example, a metal.

Although FIG. 3 shows that the graphene layer 130 shown in FIG. 1 may be used as a semiconductor and the metal compound layer 120 shown in FIG. 1 may be used as an insulator, the usage of the two layers 120 and 130 may not be limited thereto.

For example, the graphene layer 130 may serve as a conductor and the metal compound layer 120 may serve as a semiconductor. In example embodiments, the metal compound layer 120 may include at least one of CuS, CuO, and NiO.

A graphene electronic device and a manufacturing method thereof according to example embodiments are described in detail with reference to FIGS. 4 to 7.

Figure 4:
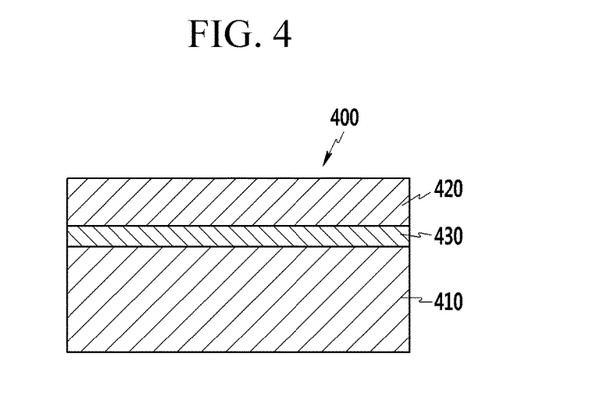
FIG. 4 is a schematic sectional view of a graphene electronic device according to example embodiments.
Figure 5:
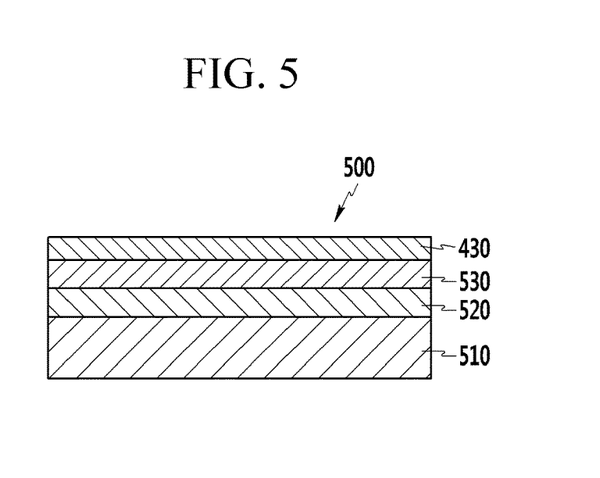
FIGS. 5 to 7 are schematic sectional views illustrating a method of manufacturing the graphene electronic device shown in FIG. 4.
Figure 6:
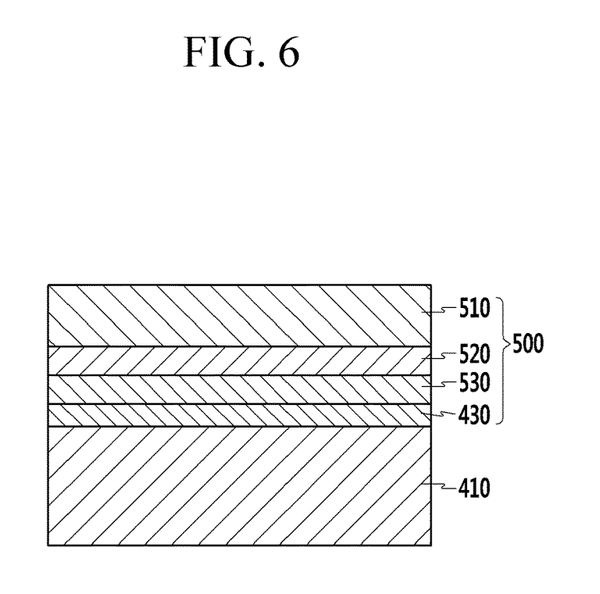
Figure 7:
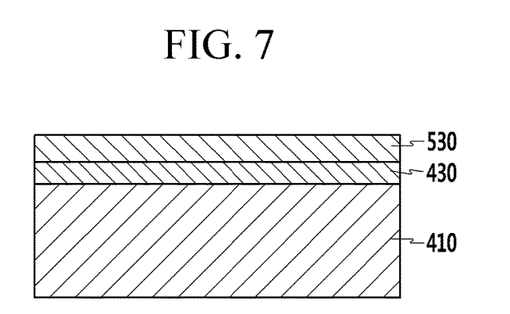

FIG. 4 is a schematic sectional view of a graphene electronic device according to example embodiments, and FIGS. 5 to 7 are schematic sectional views illustrating a method of manufacturing the graphene electronic device shown in FIG. 4.

Referring to FIG. 4, a graphene electronic device 400 according to example embodiments may include a substrate 410, and a graphene layer 430 and a metal compound layer 420 deposited on the substrate 410 in sequence. The graphene electronic device 400 according to example embodiments may be substantially the same as the graphene electronic device 100 shown in FIG. 1 with the interchanged positions of the metal compound layer 120 and the graphene layer 130, and thus the detailed description of each portions may be omitted.

An insulating layer (not shown) or a conductive layer (not shown) for example, may disposed between the substrate 410 and the graphene layer 430, and in example embodiments, the layers between the substrate 410 and the graphene layer 430 may be referred to as a part of the substrate 410.

According to a method of manufacturing the graphene electronic device 400 shown in FIG. 4, referring to FIG. 5, a sacrificial insulating layer 520 may be deposited on a sacrificial substrate 510, for example, a silicon substrate. The sacrificial insulating layer 520 may include an oxide or a nitride, for example, $SiO_2$ and $SiN_x$.

A catalyst layer 530 may be deposited on the sacrificial insulating layer 520. The catalyst layer 530 may include at least one of Cu, Co, Ni, and $CoO_x$ (0<x<1). A graphene layer 430 may be grown on the catalyst layer 530 to form a structure 500.

Referring to FIG. 6, the structure 500 formed as described above may be reversed and attached to a substrate 410. The attachment of the graphene layer 430 and the substrate 410 may be performed by using water as a medium on the substrate 410 or by thermal compression bonding.

Referring to FIG. 7, the sacrificial insulating layer 520 may be removed, for example, by wet etching, to separate the sacrificial substrate 510. Therefore, the catalyst layer 530 is disposed on the top surface.

Thereafter, the catalyst layer 530 may be converted into a metal compound layer 420. The conversion may be performed by heat treatment, for example, under an $O_2$ or S atmosphere. During the heat treatment, oxygen or sulfur may be introduced into the catalyst layer 530 to combine with the metal element in the catalyst layer 530.

For example, when the catalyst layer 530 includes Cu, the thermal treatment under oxygen circumstance may produce CuO or $Cu_2O$ depending on a thermal treatment condition, while the thermal treatment under sulfur circumstance may produce CuS. When the catalyst layer 530 includes Co or $CoO_x$, the thermal treatment under oxygen circumstance may produce CoO. When the catalyst layer 530 includes Ni, the thermal treatment under oxygen circumstance may produce NiO.

According to example embodiments, the catalyst layer 530 used for growing the graphene layer 430 may be combined with another element to form a semiconductor or an insulator that forms a part of the graphene electronic device.

Figure 8:
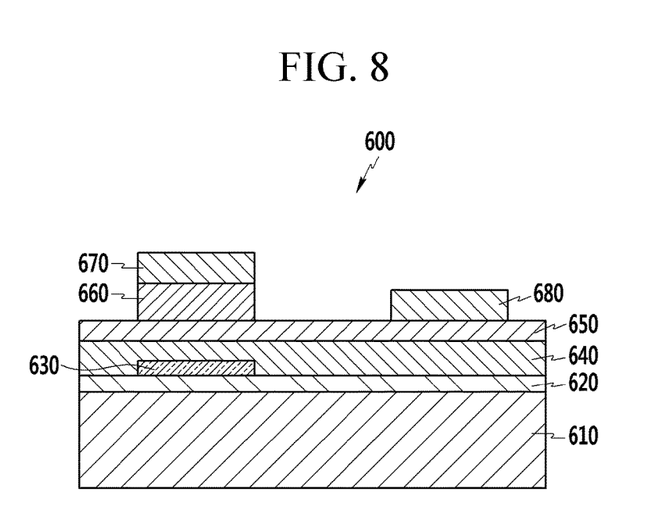
FIG. 8 is a schematic sectional view of a thin film diode according to example embodiments.

A thin film diode and a manufacturing method thereof according to example embodiments are described in detail with reference to FIGS. 8 to 12. FIG. 8 is a schematic sectional view of a thin film diode according to example embodiments, and FIGS. 9 to 12 are schematic sectional views illustrating a method of manufacturing the thin film diode shown in FIG. 8.

Referring to FIG. 8, a thin film diode 600 according to example embodiments may include a substrate 610, a subsidiary insulating layer 620, a gate electrode 630, a gate insulating layer 640, a conductive layer 650, a semiconductor layer 660, and a pair of main electrodes 670 and 680.

The substrate 610 may include a semiconductor substrate, and may include silicon. The subsidiary insulating layer 620 may be disposed on the substrate 610, and may include an oxide or a nitride, for example, $SiO_2$ and $SiN_x$. The gate electrode 630 may be disposed on the subsidiary insulating layer 620, and may include a conductive material, for example, a metal. The gate insulating layer 640 may be disposed on the subsidiary insulating layer 620 and the gate electrode 630, and may include an oxide or a nitride, for example, $SiO_2$ and $SiN_x$.

The conductive layer 650 may be disposed on the gate insulating layer 640, and may include monolayer graphene or multilayer graphene. The semiconductor layer 660 may be disposed on the conductive layer 650, may be aligned roughly with the gate electrode 630, and may include at least one of CuS, CuO, and NiO. The conductive layer 650 and the semiconductor layer 660 may correspond to the graphene layer 430 and the metal compound layer 420 shown in FIG. 4, respectively.

The pair of main electrodes 670 and 680 may be spaced apart from each other. One electrode 670 of the pair of main electrodes 670 and 680 may be disposed on the semiconductor layer 660, while the other electrode 680 of the pair of main electrodes 670 and 680 may be disposed on the conductive layer 650 and spaced apart from the semiconductor layer 660.

The thin film diode 600 according to example embodiments may include the gate electrode 630 in addition to the pair of main electrodes 670 and 680 unlike a usual diode, and the gate electrode 630 may be used in changing a current-voltage characteristic of the thin film diode 600. In detail, the current-voltage curve (i.e., I-V curve) of the thin film diode 600 may vary depending on a voltage applied to the gate electrode 630. Therefore, a desired I-V curve may be obtained by adjusting the voltage applied to the gate electrode 630.

The gate electrode 630 and the gate insulating layer 640 may be omitted.

Although FIG. 8 shows that the graphene layer 430 shown in FIG. 4 may be used as a conductor and the metal compound layer 420 shown in FIG. 4 may be used as a semiconductor, the usage of the two layers 420 and 430 may not be limited thereto.

Figure 9:
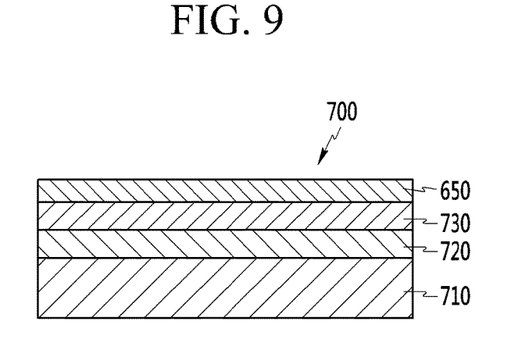
FIGS. 9 to 12 are schematic sectional views illustrating a method of manufacturing the thin film diode shown in FIG. 8.

According to an example method of manufacturing the thin film diode 600 shown in FIG. 8, referring to FIG. 9, a sacrificial insulating layer 720 may be deposited on a sacrificial substrate 710, for example, a silicon substrate. The sacrificial insulating layer 720 may include an oxide or a nitride, for example, $SiO_2$ and $SiN_x$. A catalyst layer 730 may be deposited on the sacrificial insulating layer 720. The catalyst layer 730 may include at least one of Cu and Ni.

Thereafter, a graphene layer 650 (that was previously referred to as a conductive layer when describing the structure, but is now referred to as a graphene layer because the conductive property of the graphene layer may not be revealed yet in this stage, but may be revealed after the thin film diode is completed) may be grown on the catalyst layer 730 to form a structure 700.

Figure 10:
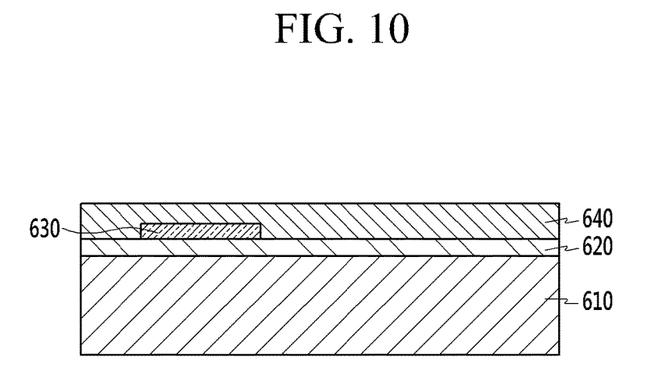

Referring to FIG. 10, a subsidiary insulating layer 620 and a conductor layer (not shown) may be deposited in sequence on a substrate 610 regardless of the structure 700. Thereafter, the conductor layer may be patterned to form a gate electrode 630, and a gate insulating layer 640 may be deposited thereon.

Figure 11:
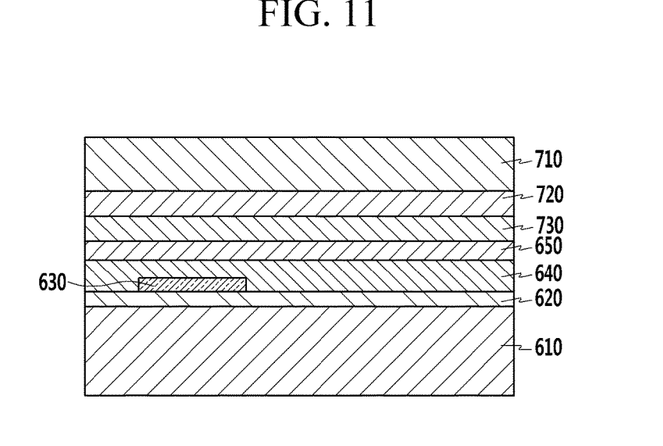

Referring to FIG. 11, the structure 700 may be reversed and attached to the gate insulating layer 640, and the sacrificial insulating layer 720 may be removed to separate the sacrificial substrate 710. Therefore, the catalyst layer 730 is disposed on the top surface.

Figure 12:
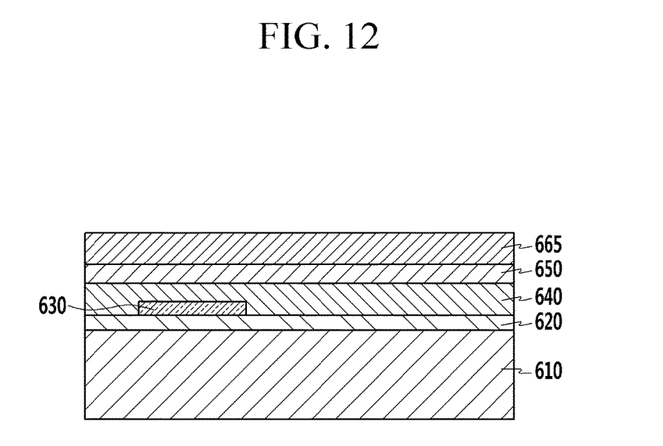

Referring to FIG. 12, the catalyst layer 730 may be converted into a metal compound layer 665 having a semiconductive property by a heat treatment. The metal compound layer 665 may include at least one of CuS, CuO, and NiO.

Referring to FIG. 8, the metal compound layer 665 may be patterned to form a semiconductor layer 660, and a conductor layer (not shown) may be deposited thereon and patterned to form a pair of main electrodes 670 and 680.

While this disclosure has been described in connection with what is presently considered to be practical example embodiments, it is to be understood that the inventive concepts are not limited to the disclosed embodiments, but, on the contrary, is intended to cover various modifications and equivalent arrangements included within the spirit and scope of the appended claims.

What is claimed is:

1. A method of manufacturing a graphene electronic device, the method comprising:
    forming a metal compound layer and a catalyst layer on a substrate, the catalyst layer including a metal element in the metal compound layer;
    growing a graphene layer on the catalyst layer;
    converting the catalyst layer into a portion of the metal compound layer; and
    forming at least one electrode on the graphene layer.

2. The method of claim 1, wherein the metal element includes at least one of copper (Cu), cobalt (Co), and nickel (Ni).

3. The method of claim 2, wherein the metal compound layer includes one of oxygen and sulfur.

4. The method of claim 3, wherein the metal compound layer includes at least one of CuS, $Cu_2S$, CuO, $Cu_2O$, CoO, and NiO, and the catalyst layer includes at least one of Cu, Co, Ni, and $COO_x$ ($0<x<1$).

5. The method of claim 1, wherein the graphene layer includes one of monolayer graphene and multilayer graphene.

6. The method of claim 5, wherein the converting includes heat treating the catalyst layer, the method further comprising:
    forming source and drain electrodes on the graphene layer;
    forming an insulating layer on the graphene layer; and
    forming a gate electrode on the insulating layer.

7. A method of manufacturing a graphene electronic device, the method comprising:
    forming a first insulating layer on a first substrate;
    forming a catalyst layer on the first insulating layer, the catalyst layer including a metal element;
    forming a graphene layer on the catalyst layer to form a structure including the first substrate, the catalyst layer, and the graphene layer;
    attaching the structure to a second substrate such that the graphene layer is closer to the second substrate than the first substrate;

removing the first insulating layer to separate the first substrate from the second substrate; and forming a metal compound layer by combining the metal element in the catalyst layer with another element.

8. The method of claim 7, wherein the metal element includes at least one of copper (Cu), cobalt (Co), and nickel (Ni).

9. The method of claim 8, wherein the metal compound layer includes one of oxygen and sulfur.

10. The method of claim 9, wherein the metal compound layer includes at least one of CuS, $Cu_2S$, CuO, $Cu_2O$, CoO, and NiO, and the catalyst layer includes at least one of Cu, Co, Ni, and $CoO_x$ (0<x<1).

11. The method of claim 7, wherein the graphene layer includes one of monolayer graphene and multilayer graphene.

12. The method of claim 11, wherein the forming the metal compound layer includes heat treating the catalyst layer, the method further comprising:

forming a first electrode and a second electrode on the metal compound layer and the graphene layer, respectively.

13. The method of claim 12, wherein before the attaching, the method further comprising:

forming a second insulating layer on the second substrate;
forming a third electrode on the second insulating layer; and
forming a third insulating layer on the third electrode,
wherein the graphene layer contacts the third insulating layer.

14. A graphene electronic device comprising:
a metal compound layer on a substrate;
a planar graphene layer on the substrate in a direction substantially perpendicular to a longitudinal direction of the substrate;
a gate electrode distinct from the substrate; and
at least one electrode on the graphene layer, the graphene layer being between the at least one electrode and the substrate and between the at least one electrode and the metal compound layer in the direction substantially perpendicular to the longitudinal direction of the substrate, and directly in contact with the metal compound layer in an area overlapping the at least one electrode in the direction substantially perpendicular to the longitudinal direction of the substrate, wherein the metal compound layer is a single continuous layer, includes a metal element configured to serve as a catalyst for growing the graphene layer and extends across an entire length of the graphene layer.

15. The graphene electronic device of claim 14, wherein the metal element includes at least one of copper (Cu), cobalt (Co), and nickel (Ni).

16. The graphene electronic device of claim 15, wherein the metal compound layer includes one of oxygen and sulfur.

17. The graphene electronic device of claim 16, wherein the metal compound layer includes at least one of CuS, $Cu_2S$, CuO, $Cu_2O$, CoO, and NiO.

18. The graphene electronic device of claim 14, wherein the graphene layer includes one of monolayer graphene and multilayer graphene.

19. The graphene electronic device of claim 18, further comprising:

first and second electrodes on the graphene layer, the first and second electrodes spaced apart from each other;
an insulating layer on the graphene layer; and
the gate electrode being on the insulating layer,
wherein the graphene layer is between the substrate and the metal compound layer.

20. The graphene electronic device of claim 18, further comprising:

a first insulating layer between the substrate and the graphene layer;
a second insulating layer between the first insulating layer and the graphene layer;
the gate electrode being between the first insulating layer and the second insulating layer;
a second electrode on the metal compound layer; and
a third electrode on the graphene layer, the third electrode spaced apart from the second electrode and the metal compound layer,
wherein the graphene layer is between the substrate and the metal compound layer, and the metal compound layer exposes a portion of the graphene layer.

* * * * *